(12) United States Patent
Hayashi

(10) Patent No.: US 8,766,278 B2
(45) Date of Patent: Jul. 1, 2014

(54) SILICON CARBIDE SEMICONDUCTOR DEVICE

(75) Inventor: Hideki Hayashi, Osaka (JP)

(73) Assignee: Sumitomo Electric Industries, Ltd., Osaka-Shi (JP)

( * ) Notice: Subject to any disclaimer, the term of this patent is extended or adjusted under 35 U.S.C. 154(b) by 0 days.

(21) Appl. No.: 13/565,388

(22) Filed: Aug. 2, 2012

(65) Prior Publication Data

US 2013/0032824 A1    Feb. 7, 2013

Related U.S. Application Data

(60) Provisional application No. 61/515,579, filed on Aug. 5, 2011.

(30) Foreign Application Priority Data

Aug. 5, 2011 (JP) .................................. 2011-171564

(51) Int. Cl.
 *H01L 29/15* (2006.01)
 *H01L 21/8238* (2006.01)

(52) U.S. Cl.
 USPC ............................................. 257/77; 438/199

(58) Field of Classification Search
 USPC ............ 257/77.134, 256, 272, 274, 287, 328, 257/329, E21.053, E21.055, E21.065
 See application file for complete search history.

(56) References Cited

U.S. PATENT DOCUMENTS

| 8,395,163 | B2 | 3/2013 | Tamaso |
| 2005/0006716 | A1 | 1/2005 | Kumar et al. |
| 2006/0081897 | A1 | 4/2006 | Yoshida |
| 2006/0197152 | A1* | 9/2006 | Tokano et al. ................. 257/341 |
| 2007/0102708 | A1* | 5/2007 | Kumar et al. .................. 257/77 |
| 2007/0200117 | A1* | 8/2007 | Kumar et al. .................. 257/77 |
| 2008/0315211 | A1* | 12/2008 | Ichikawa et al. ................ 257/77 |
| 2009/0057757 | A1 | 3/2009 | Hokomoto et al. |
| 2010/0148718 | A1 | 6/2010 | Kitabatake et al. |

FOREIGN PATENT DOCUMENTS

| JP | 48-033781 A | 5/1973 |
| JP | 56-165350 A | 12/1981 |
| JP | 10-107214 A | 4/1998 |
| JP | 2004-247496 A | 9/2004 |

(Continued)

OTHER PUBLICATIONS

Rupp et al., "SiC Power Devices: How to be Competitive Towards Si-Based Solutions?" Materials Science Forum, vols. 433-436, pp. 805-812 (2003).

(Continued)

*Primary Examiner* — Julio J Maldonado
*Assistant Examiner* — Moin Rahman
(74) *Attorney, Agent, or Firm* — Venable LLP; Michael A. Sartori; F. Brock Riggs

(57) ABSTRACT

First, second, fourth, and fifth impurity regions have a first conductivity type, and a third impurity region has a second conductivity type. The first to third impurity regions reach a first layer having the first conductivity type. The fourth and fifth impurity regions are provided on a second layer. First to fifth electrodes are provided on the first to fifth impurity regions, respectively. Electrical connection is established between the first and fifth electrodes, and between the third and fourth electrodes. A sixth electrode is provided on a gate insulating film covering a portion between the fourth and fifth impurity regions.

9 Claims, 6 Drawing Sheets

(56) References Cited

FOREIGN PATENT DOCUMENTS

| | | |
|---|---|---|
| JP | 2006-100645 A | 4/2006 |
| JP | 2009-212458 A | 9/2009 |
| JP | 2009-259963 | 11/2009 |
| JP | 2010-103229 A | 5/2010 |
| JP | 2011-512042 A | 4/2011 |
| WO | WO-2007/013367 A1 | 2/2007 |
| WO | WO-2008/156674 A1 | 12/2008 |
| WO | WO-2009/102301 A1 | 8/2009 |
| WO | WO-2009/128419 A1 | 10/2009 |

OTHER PUBLICATIONS

Domes et al., "Cascode Light—normally-on JFET stand alone performance in a normally-off Cascode circuit," Proc. PCIM Europe (2010).

Bjoerk et al., "1200V SiC JFET in Cascode Light Configuration: Comparison Versus Si and SiC Based Switches," Materials Science Forum, vols. 679-680, pp. 587-590 (2011).

U.S. Appl. No. 13/565,209, Hideki Hayashi, "Silicon Carbide Semiconductor Device,", filed Aug. 2, 2012.

Office Action in U.S. Appl. No. 13/565,209, dated Jan. 27, 2014.

* cited by examiner

SILICON CARBIDE SEMICONDUCTOR DEVICE

BACKGROUND OF THE INVENTION

1. Field of the Invention

The present invention relates to a silicon carbide semiconductor device, and in particular to a silicon carbide semiconductor device having a gate insulating film.

2. Description of the Background Art

Patent Literature 1 (International Publication No. 2008/156674) discloses a VJFET (Vertical Junction Field Effect Transistor) using SiC (silicon carbide).

Although a JFET has a low ON resistance and can perform high-speed operation, it is generally difficult for the JFET to achieve normally-off characteristics. Thus, according to Non Patent Literature 1 (R. Rupp and I. Zverev, "SiC Power Devices: How to be Competitive Towards Si-Based Solutions?", Mat. Sci. Forum, vols. 433-436 (2003), pp. 805-812), a cascode including two chips, that is, a SiC VJFET and a Si (silicon) MOSFET (Metal Oxide Semiconductor Field Effect Transistor), is used.

Since the device of Non Patent Literature 1 is configured using two chips (substrates), it has disadvantages such as increased size and increased manufacturing cost of a semiconductor device.

SUMMARY OF THE INVENTION

The present invention has been made to solve the aforementioned problem, and one object of the present invention is to provide a silicon carbide semiconductor device having a low ON resistance, capable of performing high-speed operation, having normally-off characteristics, and configured using one substrate.

A silicon carbide semiconductor device in accordance with the present invention has a silicon carbide substrate, first to sixth electrodes, and a gate insulating film. The silicon carbide substrate has first and second layers. The first layer has a first conductivity type. The second layer is provided on the first layer, and has a second conductivity type different from the first conductivity type. The silicon carbide substrate has first to fifth impurity regions. Each of the first, second, fourth, and fifth impurity regions has the first conductivity type, and the third impurity region has the second conductivity type. Each of the first to third impurity regions penetrates the second layer and reaches the first layer, and the third impurity region is arranged between the first and second impurity regions. Each of the fourth and fifth impurity regions is provided on the second layer. The first to fifth electrodes are provided on the first to fifth impurity regions, respectively. The first and fifth electrodes are electrically connected with each other, and the third and fourth electrodes are electrically connected with each other. The gate insulating film covers a portion between the fourth and fifth impurity regions on the second layer. The sixth electrode is provided on the gate insulating film.

The silicon carbide semiconductor device can switch conduction between a terminal composed of the third and fourth electrodes and a terminal composed of the second electrode, in accordance with a potential of the sixth electrode. Since channel control utilizing a depletion layer in a pn junction between the first layer and the third impurity region and channel control utilizing an insulated gate over the second layer are performed in a coordinated manner, the device has both advantages of a junction transistor and advantages of an insulated gate transistor. Specifically, as with a junction transistor, the device can perform high-speed operation, and has a low ON resistance. In addition, as with an insulated gate transistor, the device can readily achieve normally-off characteristics. Further, since the silicon carbide semiconductor device is formed using one silicon carbide substrate, the silicon carbide semiconductor device can be configured with one chip.

Preferably, the first conductivity type is n type. This can improve carrier mobility.

Preferably, each of the first to fifth electrodes is an ohmic electrode. Thereby, ohmic contact can be established between each of the first to fifth electrodes and the silicon carbide substrate.

Preferably, the silicon carbide substrate includes a third layer, the second and third layers sandwiching the first layer, the third layer having the second conductivity type and being electrically connected with the first electrode. Thereby, electric field concentration within the first layer can be mitigated.

Preferably, the first electrode and the fifth electrode are integrated on the silicon carbide substrate. Thereby, electrical connection can be established between the first electrode and the fifth electrode without especially providing a wiring structure.

Preferably, the third electrode and the fourth electrode are integrated on the silicon carbide substrate. Thereby, electrical connection can be established between the third electrode and the fourth electrode without especially providing a wiring structure.

Preferably, the silicon carbide semiconductor device has an interlayer insulating film provided on the second layer and having first and second openings. The first and second electrodes abut on the silicon carbide substrate within the first and second openings, respectively. This can prevent each of the first and second electrodes from coming into contact with a region other than a desired region on the silicon carbide substrate.

Preferably, the gate insulating film and the interlayer insulating film are of an identical material. Thereby, the gate insulating film and the interlayer insulating film can be formed using an identical material. Therefore, a manufacturing method can be further simplified.

Preferably, the gate insulating film and the interlayer insulating film have an identical thickness. Thereby, the gate insulating film and the interlayer insulating film can be formed at a time by patterning one layer.

As described above, according to the present invention, a silicon carbide semiconductor device capable of performing high-speed operation, having a low ON resistance, having normally-off characteristics, and configured with one chip can be obtained.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
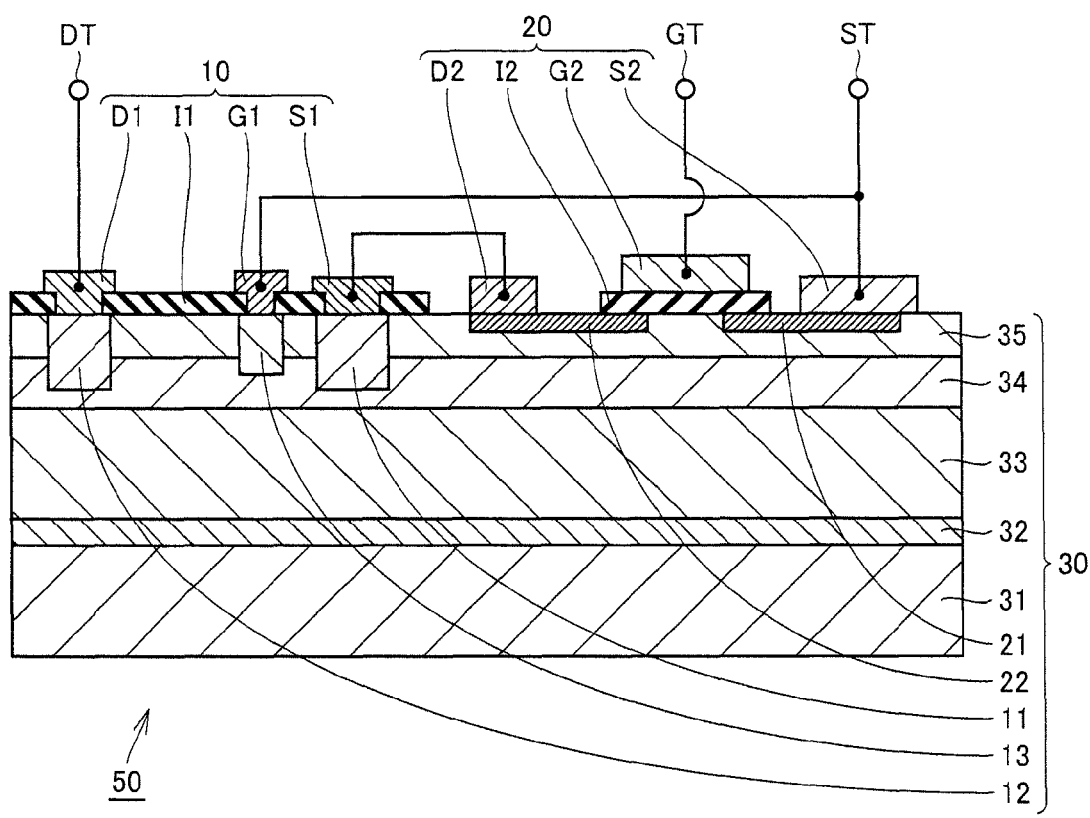
FIG. 1 is a cross sectional view schematically showing a configuration of a silicon carbide semiconductor device in accordance with Embodiment 1 of the present invention.

Hereinafter, embodiments of the present invention will be described with reference to the drawings. In the drawings, identical or corresponding parts will be designated by the same reference numerals, and the description thereof will not be repeated.

(Embodiment 1)

As shown in FIG. 1, a switching element (silicon carbide semiconductor device) 50 in the present embodiment has an epitaxial substrate (silicon carbide substrate) 30, a first electrode S1, a second electrode D1, a third electrode G1, a fourth electrode S2, a fifth electrode D2, a sixth electrode G2, an interlayer insulating film I1, and a gate oxide film I2 (gate insulating film).

Epitaxial substrate 30 is made of SiC, and has a single crystal substrate 31, a buffer layer 32, an n layer (first layer) 34, an upper p layer (second layer) 35, and a lower p layer (third layer) 33. N layer 34 has n type (a first conductivity type). Each of lower p layer 33 and upper p layer 35 has p type (a second conductivity type different from the first conductivity type). Buffer layer 32 is provided on single crystal substrate 31. Lower p layer 33 is provided on buffer layer 32. N. layer 34 is provided on lower p layer 33. Upper p layer 35 is provided on n layer 34. Thus, upper p layer 35 and lower p layer 33 sandwich n layer 34 therebetween in a thickness direction.

Epitaxial substrate 30 has a first impurity region 11, a second impurity region 12, a third impurity region 13, a fourth impurity region 21, and a fifth impurity region 22. Each of first, second, fourth, and fifth impurity regions 11, 12, 21, 22 has n type, and third impurity region 13 has p type. Each of first to third impurity regions 11 to 13 penetrates upper p layer 35 and reaches n layer 34, and third impurity region 13 is arranged between first and second impurity regions 11, 12. Each of fourth and fifth impurity regions 21, 22 is provided on upper p layer 35. Each of first impurity region 11, second impurity region 12, third impurity region 13, fourth impurity region 21, and fifth impurity region 22 is provided on an upper surface (one surface) of epitaxial substrate 30.

First to fifth electrodes S1, D1, G1, S2, D2 are provided on first to fifth impurity regions 11, 12, 13, 21, 22, respectively. First and fifth electrodes S1, D2 are electrically connected with each other, and third and fourth electrodes G1, S2 are electrically connected with each other. Preferably, each of first to fifth electrodes S1, D1, G1, S2, D2 is an ohmic electrode.

Gate oxide film I2 covers a portion between fourth and fifth impurity regions 21, 22 on upper p layer 35. Sixth electrode G2 is provided on gate oxide film I2.

Switching element 50 has interlayer insulating film I1 provided on upper p layer 35 and having first and second openings. First and second electrodes S1, D1 abut on epitaxial substrate 30 within the first and second openings, respectively. Preferably, gate oxide film I2 and interlayer insulating film I1 are of an identical material. More preferably, gate oxide film I2 and interlayer insulating film I1 have an identical thickness.

Figure 2:
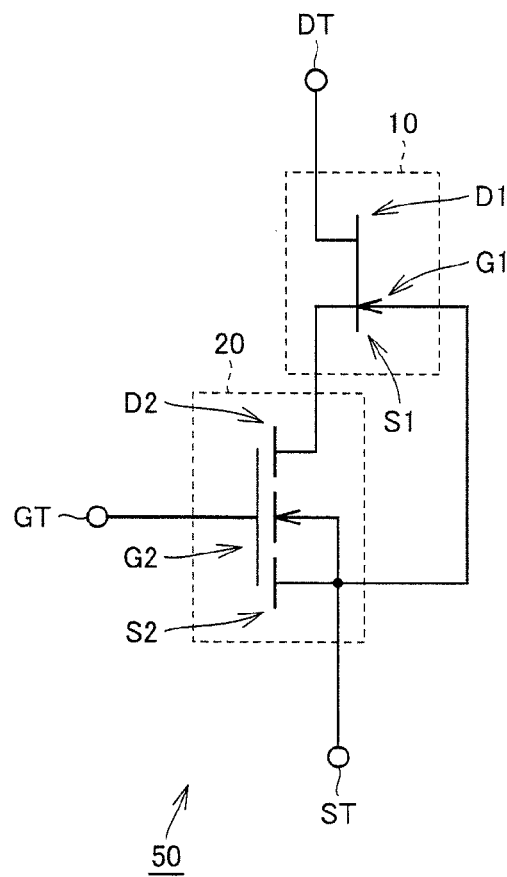
FIG. 2 is a view schematically showing an equivalent circuit of the silicon carbide semiconductor device of FIG. 1.

As shown in FIG. 2, an equivalent circuit of switching element 50 has a drain terminal DT, a source terminal ST, and a gate terminal GT for external connection, and has a JFET portion 10 and a MOSFET portion 20 as internal components thereof.

Specifically, sixth electrode G2 corresponds to gate terminal GT. A portion where third electrode G1 and fourth electrode S2 are electrically connected with each other corresponds to source terminal ST. Second electrode D1 corresponds to drain terminal DT. First electrode S1, second electrode D1, and third electrode G1 correspond to a source, a drain, and a gate of JFET portion 10, respectively. Fourth electrode S2, fifth electrode D2, and sixth electrode G2 correspond to a source, a drain, and a gate of MOSFET portion 20, respectively. Electrically connecting first and fifth electrodes S1, D2 with each other corresponds to electrically connecting the source of JFET portion 10 and the drain of MOSFET portion 20. Electrically connecting third and fourth electrodes G1, S2 with each other corresponds to electrically connecting the gate of JFET portion 10 and the source of MOSFET portion 20.

Namely, JFET portion 10 and MOSFET portion 20 connected in cascode with each other constitute an element having three terminals, that is, drain terminal DT, source terminal ST, and gate terminal GT. With this constitution, switching element 50 can perform switching between drain terminal DT and source terminal ST by applying a voltage to gate terminal GT. Specifically, in the case of an n channel, an ON state can be established between drain terminal DT and source terminal ST by setting a potential of gate terminal GT to a positive potential which is not less than a threshold value, and an OFF state can be established between drain terminal DT and source terminal ST, for example, by setting the potential of gate terminal GT to less than the threshold value (for example, a ground potential).

Next, a method for manufacturing switching element 50 will be described.

Figure 3:
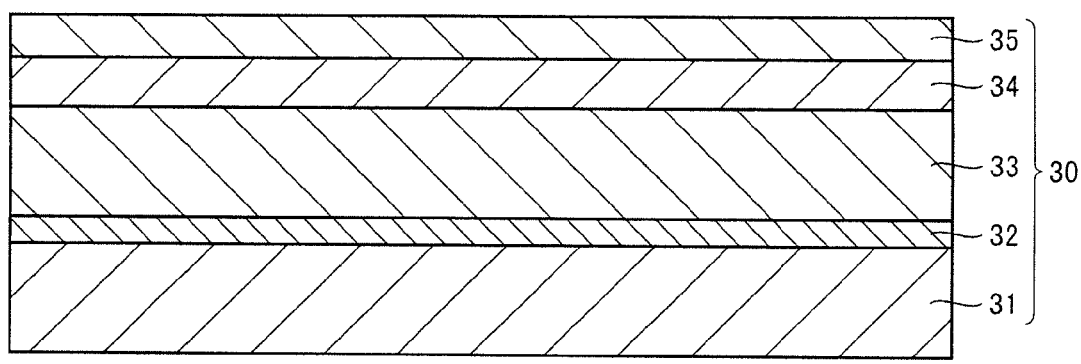
FIG. 3 is a cross sectional view schematically showing a first step of a method for manufacturing the silicon carbide semiconductor device in Embodiment 1 of the present invention.

As shown in FIG. 3, epitaxial substrate 30 is formed. Specifically, buffer layer 32, lower p layer 33, n layer 34, and upper p layer 35 are formed in this order on single crystal substrate 31 by epitaxial growth. The epitaxial growth can be performed, for example, by a CVD (Chemical Vapor Deposition) method.

Figure 4:
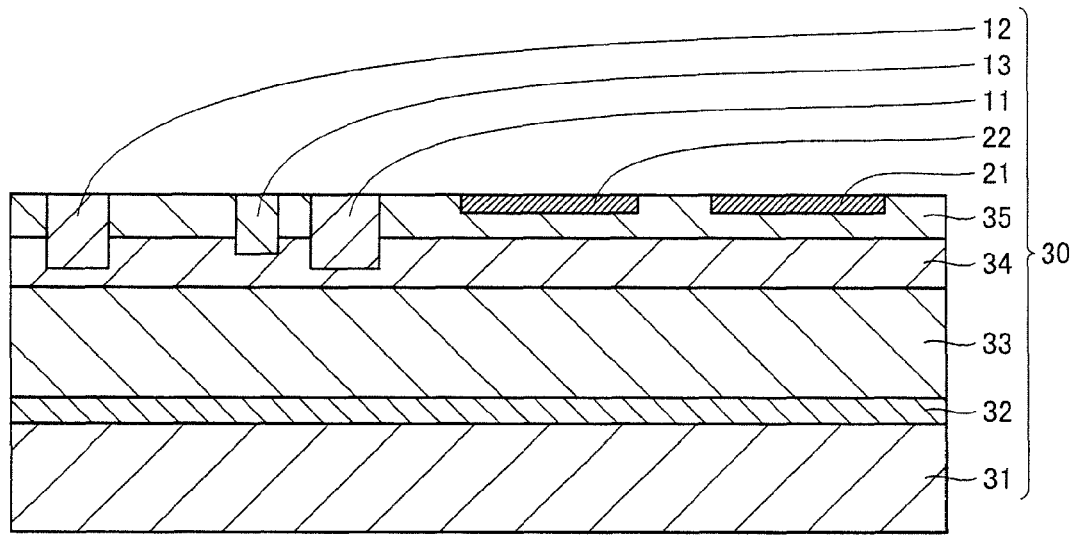
FIG. 4 is a cross sectional view schematically showing a second step of the method for manufacturing the silicon carbide semiconductor device in Embodiment 1 of the present invention.

As shown in FIG. 4, first impurity region 11, second impurity region 12, third impurity region 13, fourth impurity region 21, and fifth impurity region 22 are formed on the upper surface of epitaxial substrate 30. Formation of the impurity regions can be performed, for example, by an ion implantation method.

Figure 5:
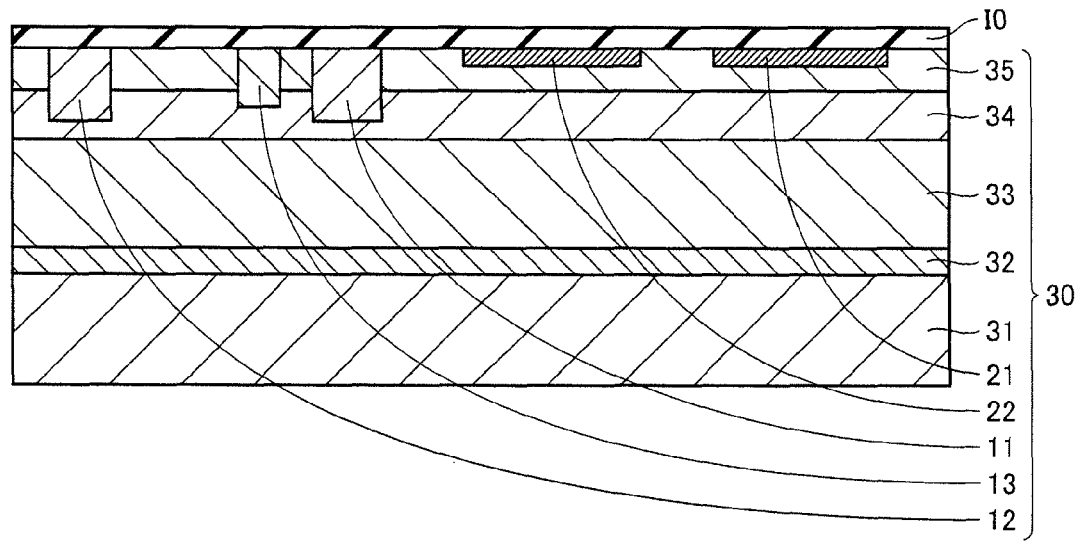
FIG. 5 is a cross sectional view schematically showing a third step of the method for manufacturing the silicon carbide semiconductor device in Embodiment 1 of the present invention.

As shown in FIG. 5, an insulating film I0 is formed on the upper surface of epitaxial substrate 30. Formation of insulating film I0 can be performed, for example, by a thermal oxidation method.

Figure 6:
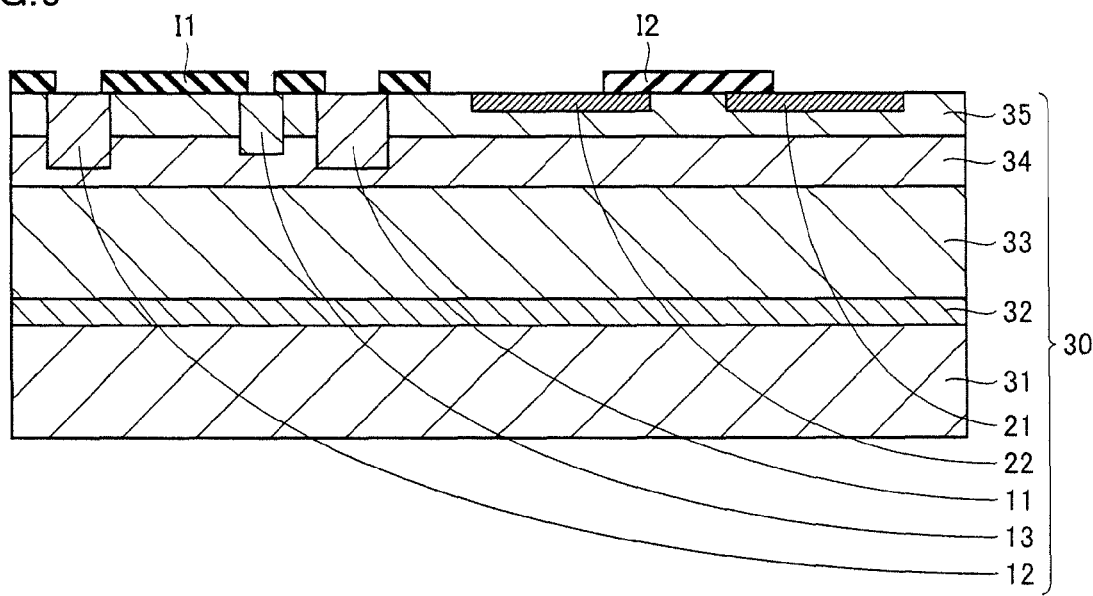
FIG. 6 is a cross sectional view schematically showing a fourth step of the method for manufacturing the silicon carbide semiconductor device in Embodiment 1 of the present invention.

As shown in FIG. 6, by patterning insulating film I0, interlayer insulating film I1 and gate oxide film I2 are formed from insulating film I0. The patterning can be performed, for example, using a photolithography method.

As shown in FIG. 1, first to fifth electrodes S1, D1, G1, S2 and D2 are formed as ohmic electrodes. Further, sixth electrode G2 is formed on gate oxide film I2.

A wiring structure electrically connecting third electrode G1 and fourth electrode S2 with each other is provided. Further, a wiring structure electrically connecting first electrode S1 and fifth electrode D2 with each other is provided.

As described above, switching element 50 is obtained.

Switching element 50 in the present embodiment can switch conduction between source terminal ST composed of third and fourth electrodes G1, S2 and drain terminal DT composed of second electrode D1, in accordance with the potential of gate terminal GT composed of sixth electrode G2. Since channel control utilizing a depletion layer in a pn junction between n layer 34 and third impurity region 13 and channel control utilizing sixth electrode G2 (insulated gate) over upper p layer 35 are performed in a coordinated manner, the device has both advantages of a junction transistor and advantages of an insulated gate transistor. Specifically, as with a junction transistor, the device can perform high-speed operation, and has a low ON resistance. In addition, as with an insulated gate transistor, the device can readily achieve normally-off characteristics. Further, since the switching element is formed using one epitaxial substrate 30, the switching element can be configured with one chip.

Further, each of first to fifth electrodes S1, D1, G1, S2, D2 is an ohmic electrode. Thereby, ohmic contact can be established between each of first to fifth electrodes S1, D1, G1, S2, D2 and epitaxial substrate 30.

Further, switching element 50 has interlayer insulating film I1 provided on upper p layer 35 and having the first and second openings. The first and second electrodes abut on epitaxial substrate 30 within the first and second openings, respectively. This can prevent each of first and second electrodes S1, D1 from coming into contact with a region other than a desired region on epitaxial substrate 30.

Further, gate oxide film I2 and interlayer insulating film I1 are of an identical material. Thereby, gate oxide film I2 and interlayer insulating film I1 can be formed using an identical material. Therefore, the manufacturing method can be further simplified.

Further, gate oxide film I2 and interlayer insulating film I1 have an identical thickness. Thereby, gate oxide film I2 and interlayer insulating film I1 can be formed at a time by patterning insulating film I0 (FIG. 5).

(Embodiment 2)

In the present embodiment, a planar layout of first to sixth electrodes S1, D1, G1, S2, D2, and G2 will be particularly described.

Figure 7:
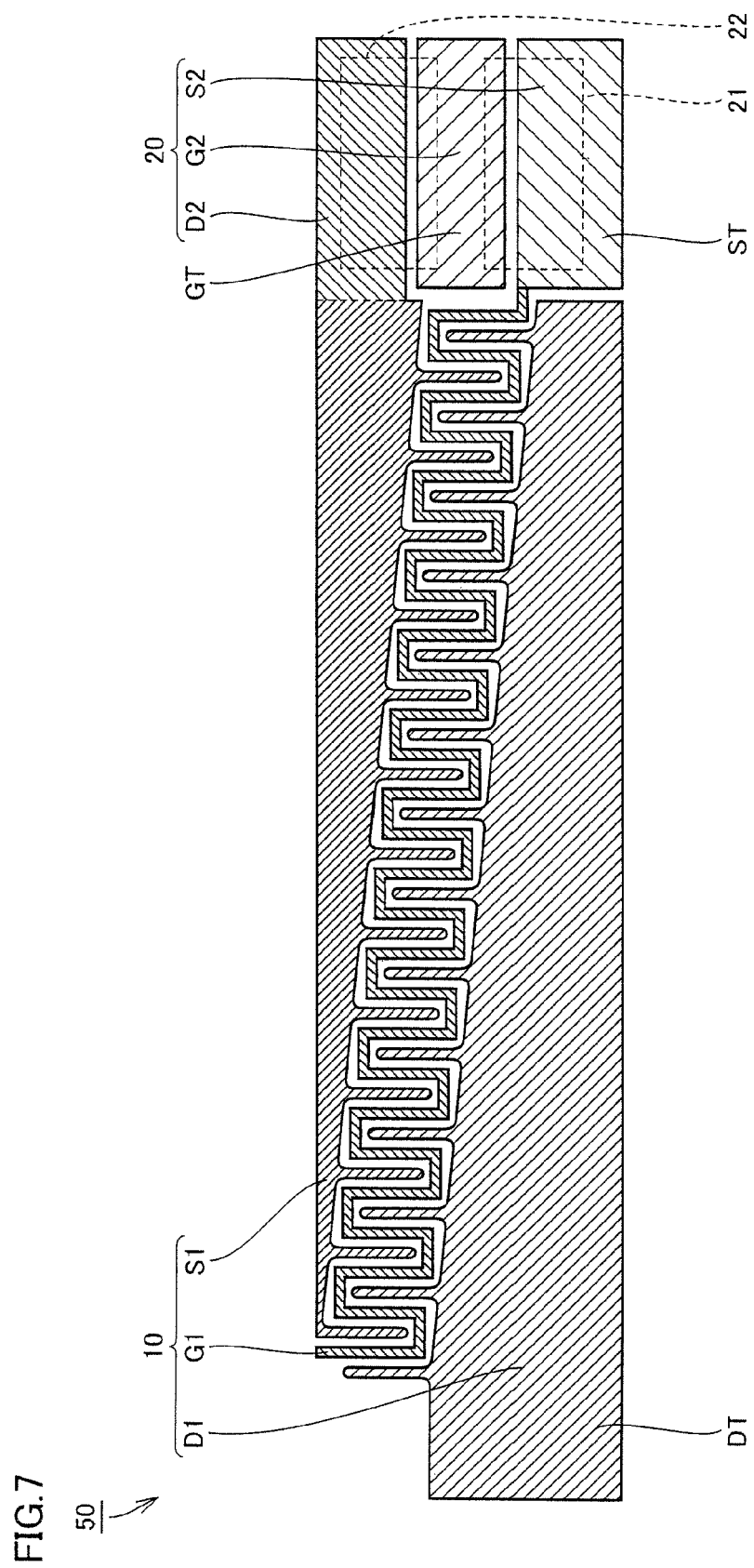
FIG. 7 is a plan view schematically showing a configuration of a silicon carbide semiconductor device in Embodiment 2 of the present invention.

In a plan view shown in FIG. 7, first electrode S1 and fifth electrode D2 are integrated on epitaxial substrate 30. Thereby, electrical connection can be established between first electrode S1 and fifth electrode D2 without especially providing a wiring structure.

Further, third electrode G1 and fourth electrode S2 are integrated on epitaxial substrate 30. Thereby, electrical connection can be established between third electrode G1 and fourth electrode S2 without especially providing a wiring structure.

It is to be noted that, other than the foregoing, the configuration of Embodiment 2 is substantially the same as that of Embodiment 1 described above. Thus, identical or corresponding components will be designated by the same reference numerals, and the description thereof will not be repeated.

(Embodiment 3)

Figure 8:
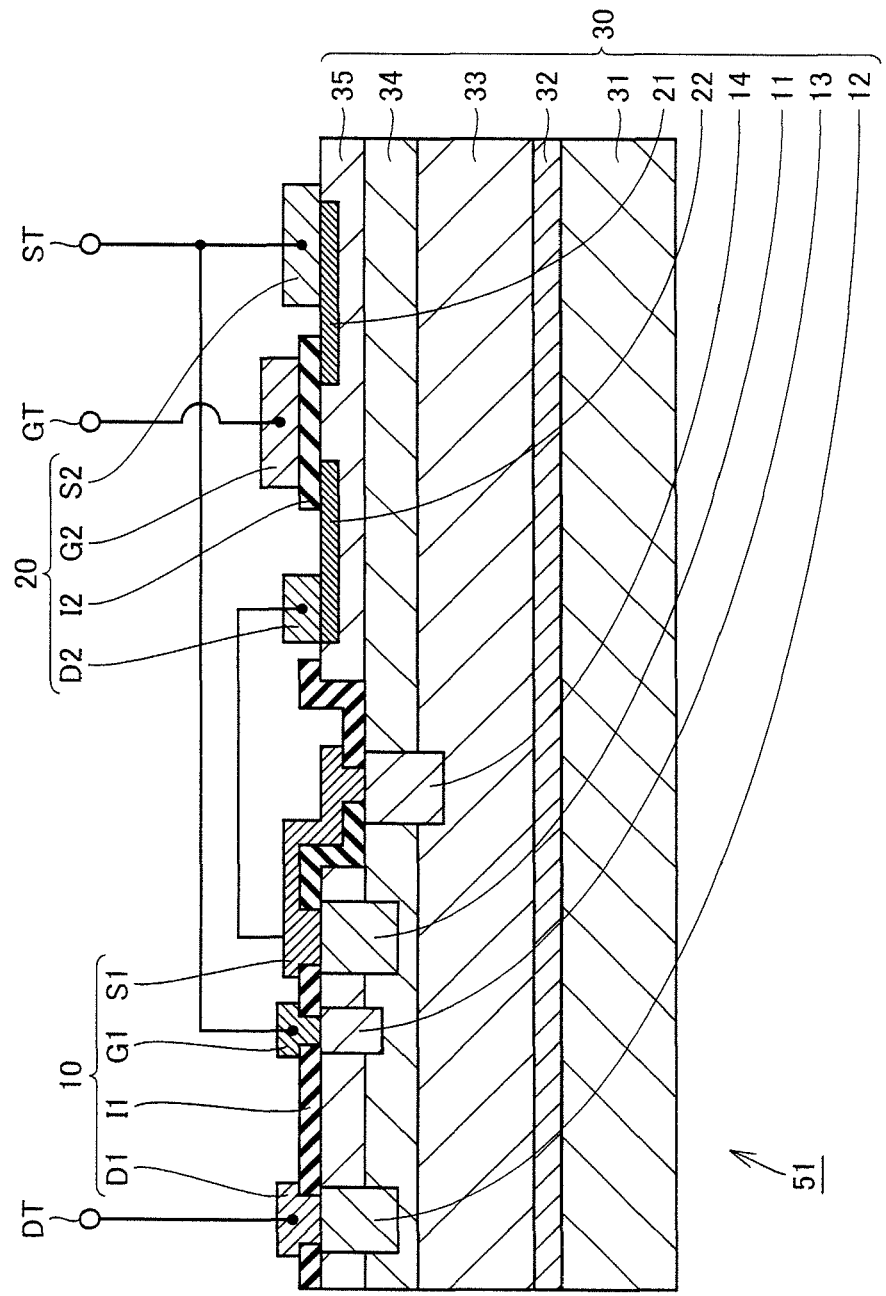
FIG. 8 is a cross sectional view schematically showing a configuration of a silicon carbide semiconductor device in Embodiment 3 of the present invention.

As shown in FIG. 8, in a switching element 51 (silicon carbide semiconductor device) in the present embodiment, upper p layer 35 is provided on a portion of n layer 34, and thus a portion of n layer 34 is exposed. Further, epitaxial substrate 30 has a sixth impurity region 14. Sixth impurity region 14 penetrates exposed n layer 34 and reaches lower p layer 33, and has p type. Furthermore, first electrode S1 is electrically connected with sixth impurity region 14, and, in the present embodiment, first electrode S1 is in contact with sixth impurity region 14. With this configuration, first electrode S1 and lower p layer 33 are electrically connected via the p type sixth impurity region.

According to the present embodiment, lower p layer 33 has the same potential as that of first electrode S1, and thereby electric field concentration within n layer 34 can be mitigated.

It is to be noted that, other than the foregoing, the configuration of Embodiment 3 is substantially the same as that of Embodiment 1 or 2 described above. Thus, identical or corresponding components will be designated by the same reference numerals, and the description thereof will not be repeated.

Although an epitaxial substrate is used as a silicon carbide substrate in the embodiments described above, a silicon carbide substrate other than an epitaxial substrate may be used. In addition, the silicon carbide semiconductor device may be further provided with a member for supporting a silicon carbide substrate, and the member may be made of a material other than silicon carbide. Furthermore, although n type is desirable as the first conductivity type from the viewpoint of mobility, p type may be used.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A silicon carbide semiconductor device, comprising:
a silicon carbide substrate including (1) a first layer having a first conductivity type, (2) a second layer provided on said first layer and having a second conductivity type different from said first conductivity type, (3) a JFET portion, and (4) a MOSFET portion, said silicon carbide substrate having first to fifth impurity regions, each of said first, second, fourth, and fifth impurity regions having said first conductivity type and said third impurity region having said second conductivity type, each of said first to third impurity regions being in said JFET portion and penetrating said second layer and reaching said first layer, said third impurity region being arranged between said first and second impurity regions, each of said fourth and fifth impurity regions being in said MOSFET portion and being provided on said second layer;
first to fifth electrodes provided on said first to fifth impurity regions, respectively, said first electrode in said JFET portion and said fifth electrode in said MOSFET portion being electrically connected with each other, said third electrode in said JFET portion and said fourth electrode in said MOSFET portion being electrically connected with each other;
a gate insulating film covering a portion between said fourth and fifth impurity regions on said second layer; and
a sixth electrode provided on said gate insulating film.

2. The silicon carbide semiconductor device according to claim 1, wherein said first conductivity type is n type.

3. The silicon carbide semiconductor device according to claim 1, wherein each of said first to fifth electrodes is an ohmic electrode.

4. The silicon carbide semiconductor device according to claim 1, wherein said silicon carbide substrate includes a third layer, said second and third layers sandwiching said first layer, said third layer having said second conductivity type and being electrically connected with said first electrode.

5. The silicon carbide semiconductor device according to claim 1, wherein said first electrode and said fifth electrode are integrated on said silicon carbide substrate.

6. The silicon carbide semiconductor device according to claim 1, wherein said third electrode and said fourth electrode are integrated on said silicon carbide substrate.

7. The silicon carbide semiconductor device according to claim 1, further comprising an interlayer insulating film provided on said second layer and having first and second openings,
wherein said first and second electrodes abut on said silicon carbide substrate within said first and second openings, respectively.

8. The silicon carbide semiconductor device according to claim 7, wherein said gate insulating film and said interlayer insulating film are of an identical material.

9. The silicon carbide semiconductor device according to claim 8, wherein said gate insulating film and said interlayer insulating film have an identical thickness.

* * * * *